US005862185A

United States Patent [19]
März

[11] Patent Number: 5,862,185
[45] Date of Patent: Jan. 19, 1999

[54] DATA SIGNAL ZERO CROSSING DETECTION PROCESS

[75] Inventor: Freimut März, Oberschleissheim, Germany

[73] Assignee: Tektronix, Inc., Wilsonville, Oreg.

[21] Appl. No.: 776,468

[22] PCT Filed: Jul. 18, 1995

[86] PCT No.: PCT/DE95/00978

§ 371 Date: May 19, 1997

§ 102(e) Date: May 19, 1997

[87] PCT Pub. No.: WO96/03826

PCT Pub. Date: Feb. 8, 1996

[30] Foreign Application Priority Data

Jul. 21, 1994 [DE] Germany ............ 44 26 712.6

[51] Int. Cl.$^6$ ............................................ H03K 9/00
[52] U.S. Cl. .................. 375/316; 375/316; 375/317; 327/79
[58] Field of Search ...................... 375/316, 317, 375/371; 327/1, 50, 72, 73, 74, 451, 79, 105; 341/164, 158

[56] References Cited

U.S. PATENT DOCUMENTS

| | | | |
|---|---|---|---|
| 3,727,079 | 4/1973 | Garrett | 327/79 |
| 4,590,600 | 5/1986 | Beeman et al. | 375/99 |
| 4,759,035 | 7/1988 | McGary et al. | 375/12 |
| 5,051,616 | 9/1991 | Stuchbury | 327/79 |

FOREIGN PATENT DOCUMENTS

| | | |
|---|---|---|
| 56-115023 | 9/1981 | Japan . |
| 1-170214 | 7/1989 | Japan . |
| 2095064 | 9/1982 | United Kingdom . |
| WO 92/14322 | 8/1992 | WIPO . |

OTHER PUBLICATIONS

Braquet, Zero–Crossing Detector, IBM TDB vol. 18, No. 1, p. 144, Jun. 1975.
Journal of Lightwave Technology, Bd. 7, Nr. 11, Nov. 1989, New York, US, pp. 1634–1640.
U. Tietze, Ch. Schenk, "Halbleiter–Schaltungstechnik", 3. Auflage, 1976, Seiten 296–297.

*Primary Examiner*—Stephen Chin
*Assistant Examiner*—Shuwang Liu
*Attorney, Agent, or Firm*—Richard L. Mayer; Thomas F. Lenihan

[57] ABSTRACT

The invention concerns a process for detecting the zero crossings of a data signal by employing of a comparator. To be able to accurately detect zero crossings even when the data signal is distorted due to transmission over a system with filtering characteristics, an auxiliary voltage corresponding to half the value of the difference between the measured maximum value of the data signal and the measured minimum value is generated. An additional voltage is formed by comparing a reference quantity that is proportional to the auxiliary voltage with the respective instantaneous value of the data signal and is added to the auxiliary voltage to form a total voltage. The total voltage is used to form the reference voltage of the comparator.

5 Claims, 2 Drawing Sheets

DATA SIGNAL ZERO CROSSING DETECTION PROCESS

BACKGROUND OF THE INVENTION

The present invention concerns a process for detecting the zero crossings of a data signal by means of a comparator.

Such a process is disclosed, for example, in the book by U. Tietze and Ch. Schenk "Halbleiter-Schaltungstechnik" Semiconductor Circuitry $3^{rd}$ edition, 1976, pages 296 and 297. In this known process, a difference amplifier receives a reference voltage at one input and at another input it receives an input voltage to be monitored. In this known process, a maximum voltage appears at the output of the difference amplifier when the input voltage is higher than the reference voltage, and a minimum output voltage occurs when the input voltage is lower than the reference voltage, so a zero crossing of the input voltage can be detected due to the change in output voltage if the reference voltage is selected accordingly.

The aforementioned process does not lend itself to accurate detection of zero crossings of a data signal if the data signal has been transmitted over a system with filtering characteristics. Such a system exists, for example, with symmetrical lines in communications technology, where transformers are normally used. The transformers result in high-pass characteristics. As a result, the individual pulses transmitted have a rather marked pulse tilt even in the case of data signals with a constant signal level. The full swing of the next pulse of the data signals begins at the end of the pulse tilt of each individual pulse of the data signal, so it is impossible to accurately detect the zero crossing with a comparator having a fixed threshold because of the significant rise time of the individual pulses of the data signal. This then results in a phase jitter that is random because it depends on the data content. This is not negligible in accurate measurements and therefore must be suppressed.

SUMMARY OF THE INVENTION

An object of this invention is to propose a process for detecting the zero crossings of a data signal by means of a comparator with which data signal zero crossings can be detected accurately.

To achieve this object according to this invention, an auxiliary voltage corresponding to half the value of the difference between the maximum value determined for the data signal and the minimum value determined is generated, and an additional voltage is formed by comparing a reference quantity that is proportional to the auxiliary voltage with the instantaneous value of the data signal where the characteristic of the additional voltage reflects an offset-like change in the data signal; the auxiliary voltage and the additional voltage are added, forming a total voltage which is used to form the reference voltage of the comparator.

Such a device is known from the journal "Journal of Lightwave Technology", vol. 7 (1989), November, no. 11, p. 1634–1640, which teaches the automatic setting of a threshold value within the context of data regeneration. However, this device has a total of three decision modules with which an input signal can be tested for an average threshold value that is lower by a predetermined deviation. A threshold value generator is controlled by means of two deviation detecting circuits downstream from the decision modules over a downstream control signal generator so that the number of pulses delivered by the deviation detecting circuits is the same, so an average threshold value adapted to the respective input signal is set.

The essential advantage of the process according to this invention is that the reference voltage of the comparator is adapted to offset-like changes in the data signal variation over time, so a fixed reference voltage is not used for the comparator. Another advantage of the process according to this invention is that it can be carried out at comparatively little cost because only an easily generated auxiliary voltage and the additional voltage need to be produced to form the reference voltage.

The auxiliary voltage can be generated according to a measured peak-to-peak swing of the data signal or it can be a fixed preset voltage. If the process according to this invention is used in measurement devices already equipped with a computer for other reasons, then the auxiliary voltage is preferably generated by the computer with a downstream digital-analog converter.

In the process according to this invention, the additional voltage can also be generated in various ways. However, it is thought to be especially advantageous if the auxiliary voltage is formed by supplying the reference quantity on the one hand and the data signal on the other hand to the input of an auxiliary comparator. A sample-and-hold circuit is released to sample the data signal when the data signal is less than the reference quantity, and it is blocked by a pulse of the system clock to form the additional voltage.

In an advantageous embodiment of the process according to this invention, another comparator and an additional comparator are used to detect zero crossings of data signals of multi-stage codes, where each comparator receives the data signal at one input, and the other comparator is preset at a predefined lower threshold for the data signals while the additional comparator is preset at a predefined upper threshold. The other comparator receives as the reference voltage at its other input a differential voltage determined from the total voltage and a reference quantity that is proportional to the auxiliary voltage; the additional comparator receives as the reference voltage at its other input a voltage corresponding to the sum of the total voltage and the reference quantity. Downstream from the other comparator is a first timer and downstream from the first comparator is a second timer, with the period of time set on the first timer being shorter than the duration of a data signal, and with the period of time set on the second timer being shorter than the time of the first timer but longer than the maximum expected rise time of a data signal. Downstream from the two timers and the additional comparator is a common AND element for extracting a triggering signal, and downstream from the common AND element there is an additional timer that delivers an analysis signal corresponding to the relevant data signal when the triggering signal at its output decreases.

Such a design of the process according to this invention can be used to advantage, for example, in measuring the phase jitter of data signals of multi-stage binary codes, such as those used as ternary or quaternary codes in ISDN (integrated services digital network) systems. Since ISDN data signals do not have a very steep edge, a jitter measurement cannot be performed easily at a zero crossing of the data signals because reproducible measurement results cannot be obtained without special measures. Therefore, those data signals that run over the full signal swing defined by the respective code are detected as the relevant data signals. With this embodiment of the process according to this invention, the zero crossings of the rising edges of these relevant data signals can be detected accurately.

To be able to test relevant data signals with regard to their falling edges, in another advantageous embodiment of the process according to this invention, another comparator and an additional comparator are used for detecting zero crossings of data signals of multi-stage codes with a full signal swing, with each comparator receiving the data signal at one input and the additional comparator being preset at a predefined lower threshold for the data signals and the additional comparator being preset at a predefined upper threshold; at its other input the other comparator receives as the reference voltage a difference voltage of the total voltage and a reference quantity that is proportional to the auxiliary voltage, and the additional comparator receives as the reference voltage at its other input a voltage corresponding to the sum of the total voltage and the voltage corresponding to the reference quantity; Downstream from the additional comparator there is a third timer and downstream from the first comparator there is a timing circuit, where the time set on the third timer is shorter than the duration of a data signal, and the time set on the timing circuit is shorter than the duration of the third timer but longer than the maximum expected decay time of a data signal. Downstream from the third timer and the timing circuit as well as the other comparator there is a common AND circuit for extracting a triggering signal, and downstream from the common AND circuit there is an additional timer that delivers an analysis signal corresponding to the relevant data signal when the triggering signal at its output falls.

It is often necessary or mandated that the relevant data signals be tested with regard to their rising and falling edges together. This requirement is taken into account in another advantageous embodiment of the process according to this invention. In this embodiment starting from the circuitry according to this invention for analyzing rising flanks to detect the zero crossings of data signals of multi-stage codes with a full signal swing, another comparator and an additional comparator that receive the data signal at one input are used. The other comparator is preset at a predefined lower threshold for the data signals and the additional comparator is preset at a predefined upper threshold. The other comparator receives as the reference signal at its other input a difference voltage of the total voltage and the reference quantity, and the additional comparator receives as the reference voltage at its other input a voltage corresponding to the sum of the total voltage and the voltage corresponding to reference quantity; Downstream from the additional comparator there is a first timer, and downstream from the first comparator there is a timing circuit. The period of time set on the third timer is shorter than the period of a data signal, and the period of time set on the timing circuit is shorter than the period of the third timer but longer than the maximum expected decay time of a data signal; Downstream from the third timer and the timing circuit as well as the other comparator there is a common AND circuit for extracting a triggering signal, and downstream from the common AND circuit there is an additional timer that delivers an analysis signal corresponding to the relevant data signal when the triggering signal at its output falls.

DETAILED DESCRIPTION

Figure 1:
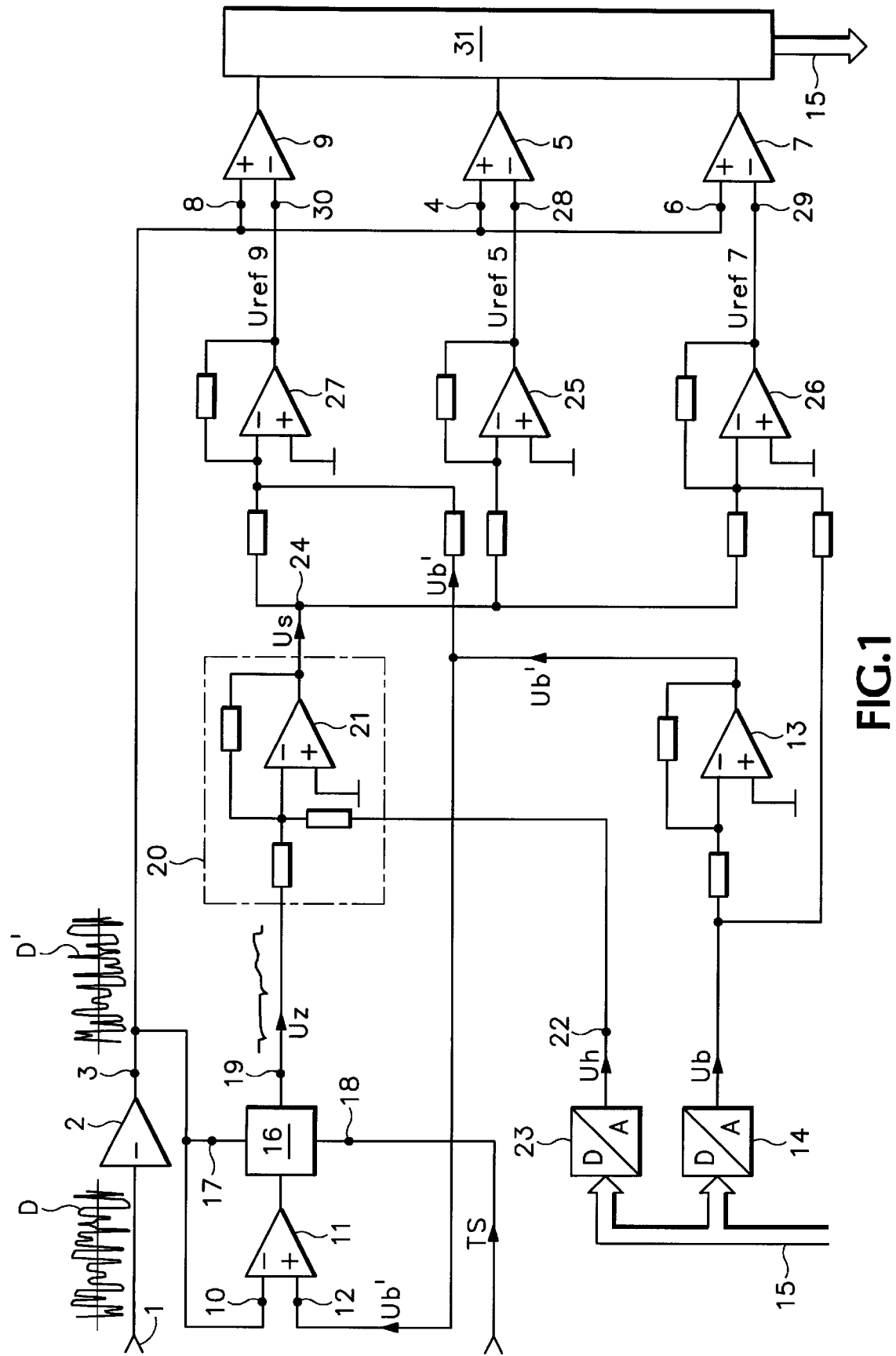
FIG. 1 shows one embodiment of a device for carrying out the process according to this invention.

As FIG. 1 shows, a data signal D that is to be tested for zero crossings and has the variation over time diagramed in the area of input 1 is received at input 1 in the device illustrated here. Data signal D is inverted in inverter 2 so inverted data signal D' whose variation is also shown appears at output 3 of the inverter.

Inverted data signal D' is received at input 4 of comparator 5, at input 6 of another comparator 7 and at input 8 of additional comparator 9. Furthermore, inverted data signal D' is sent to input 10 of auxiliary comparator 11 which receives voltage Ub' as the reference quantity at its other input 12.

Reference quantity Ub' is supplied by an operational amplifier 13 downstream from a digital-analog converter 14. This digital-analog converter 14 is in turn connected at its input to a computer (not shown) by a bus 15. The computer sends to digital-analog converter 14 a digital value corresponding to the difference between a measured maximum value and a measured minimum value of data signal D and D', respectively. Converter 14 delivers reference quantity Ub at the output.

If inverted data signal D' at input 10 of auxiliary comparator 11 is lower than the value of reference quantity Ub', a sample-and-hold circuit 16 downstream from auxiliary comparator 11 is released to sample inverted data signal D', through the connection of input 17 of sample-and-hold circuit 16 to output 3 of inverter 2. Via another input 18, sample-and-hold circuit 16 is blocked again by a clock signal TS of a system clock, derived from data signal D, for example, so an additional voltage Uz is formed at output 19 of sample-and-hold circuit 16. This additional voltage Uz is added in adder 20 which has an operational amplifier 21 to an auxiliary voltage Uh that appears at output 22 of another digital-analog converter 23. This other digital-analog converter 23 is also connected to the computer (not shown) by bus 15 and is supplied with a signal by the computer so that it delivers auxiliary voltage Uh with a level corresponding to half the value of the difference between the measured maximum value of data signal D and the measured minimum value. Thus a total voltage Us appearing at output 24 of adder 20 can be described by equation (1) below:

$$Us=(Uh+Uz) \qquad (1)$$

The total voltage Us is sent together with reference quantity Ub' to other adders having operational amplifiers 25, 26 and 27 that are upstream from comparators 5, 7 and 9. Consequently, the reference voltage at an (other) input 28 of first comparator 5 can be described by the following equation (2):

$$Uref5=-(-(Uh+Uz))=Uh+Uz \qquad (2)$$

Reference voltages Uref7 and Uref9 at the other inputs 29 and 30 of the other comparator 7 and the additional comparator 9, respectively, can be described by the following equations (3) and (4):

$$Uref7=-(Ub+(-(Uh+Uz)))=Uh+Uz-Ub \qquad (3)$$

$$Uref9=-(-Ub+(-(Uh+Uz)))=Uh+Uz+Ub \qquad (4)$$

Figure 3:
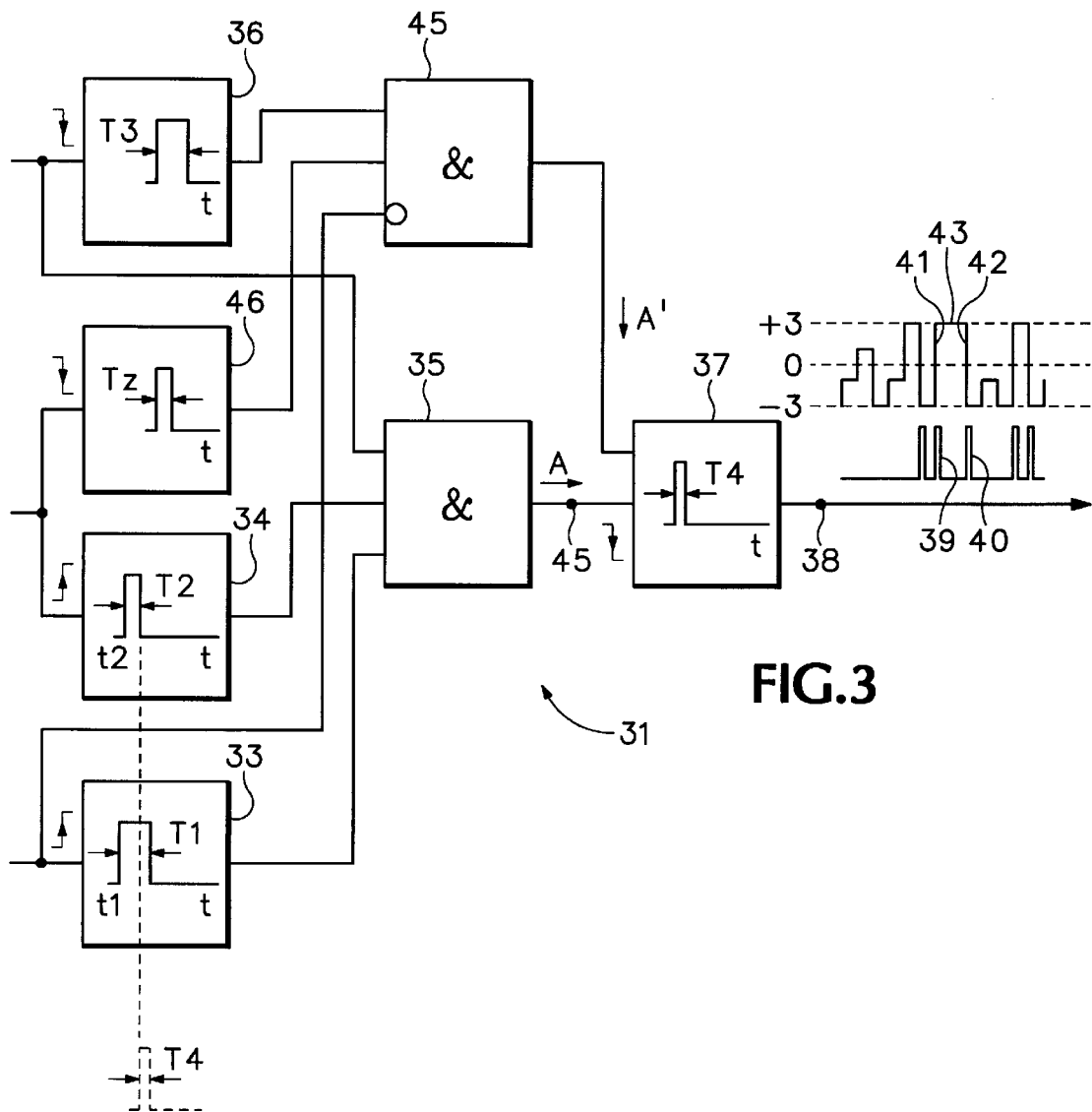
FIG. 3 shows one embodiment of the analysis circuit according to FIG. 1.

Downstream from comparators 5, 7 and 9 there is an analysis circuit 31 that is illustrated in one embodiment in FIG. 3.

To further illustrate the functioning of the device diagramed in FIG. 1, reference is made below to FIG. 2, which shows the variation of inverted data signal D' in diagram A. Reference quantity Ub' is also plotted in diagram A. In diagram B in FIG. 2, the variation of additional voltage Uz is plotted as a function of time t. Diagram B shows that the curve of additional voltage Uz reflects the offset-like change in data signal D' with respect to the zero line. A type of offset of data signal D' is thus detected by a suitably high additional voltage Uz and is taken into account in generating the reference voltage for the individual comparators 5, 7 and 9, so they work with a variable reference voltage threshold to some extent. Therefore, the three comparators 5, 7 and 9 always have the same switching points with respect to data signal D or D', which leads to a high accuracy in a phase jitter measurement.

FIG. 3 illustrates one embodiment of analysis circuit 31 downstream from comparators 5, 7 and 9 according to FIG. 1. FIG. 3 shows that a timer 33 is downstream from the other comparator 7 and a second timer 34 is downstream from the first comparator 5. The outputs of both timers 33 and 34 are connected to AND element 35, which is also connected directly to additional comparator 9.

At the output, AND element 35 is connected to an additional timer 37 whose output 38 supplies signals 39 and 40 that characterize the zero crossings of rising and falling edges 41 and 42, respectively, of a pulse 43 of a ternary data signal shown here.

The analysis circuit described so far and illustrated in FIG. 3 operates as follows:

If specifically rising flank 41 of a relevant data signal 43 is to be detected for a phase jitter measurement, then the first timer 33 is started by this flank 41. The period of time T1 set on this timer is slightly shorter than the duration of the relevant data signal 43. At a somewhat later time t2, the second timer 34, whose set time T2 is shorter than time T1 of the first timer 33 but longer than the maximum expected rise time of the relevant data signal 43, is started at the zero crossing of edge 41. When the relevant data signal 43 reaches the upper threshold +3, the two timers 33 and 34 and the additional comparator 9 send signals to AND element 35 together within a short interval. FIG. 3 shows that triggering signal A then obtained at output 44 of AND element 35 also falls when the signal of second timer 34 falls, thus starting the additional timer 37. Then analysis data signal 39, which is shown with solid lines in the curves at output 38 of additional timer 37 and corresponds to the relevant data signal 43, is generated.

Figure 2:
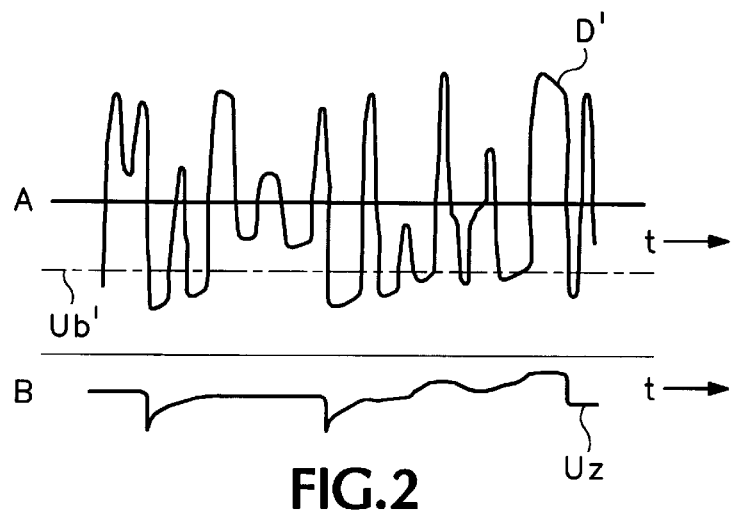
FIG. 2 shows two diagrams to illustrate voltage characteristics.

FIGS. 2 and 3 also show that the other comparator 7 is connected directly to an inverting input of an AND circuit 45; another input of AND circuit 45 is connected via timing circuit 46 to the output of comparator 5, and an additional input of AND circuit 45 is connected via a third timer 36 to the output of additional comparator 9. When the relevant data signal 43 falls, (i.e., at its falling edge), a triggering pulse A' is generated at the output of AND circuit 45, as a result of which the additional analysis data signal 40, which is shown with a dotted line at output 38 of additional timer 37, is delivered by additional timer 37.

What is claimed is:

1. A method of detecting at least one zero crossing of a data signal, comprising:

generating an auxiliary voltage corresponding to half the value of a difference between a measured maximum value of the data signal and a determined minimum value of the data signal;

generating an additional voltage resembling an offset-like change in the data signal by comparing a reference quantity with an instantaneous value of the data signal, wherein the reference quantity is proportional to the auxiliary voltage;

adding the auxiliary voltage and the additional voltage to form a total voltage; and generating, on the basis of the total voltage, a reference voltage for each of a plurality of comparators.

2. The method of claim 1, wherein the auxiliary voltage is generated as a fixed predefined voltage by a computer coupled to a digital-analog converter.

3. The method of claim 1, wherein the additional voltage is formed by having an auxiliary comparator receive the reference quantity and the data signal at respective inputs of the auxiliary comparator and by releasing a sample-and-hold circuit to sample the data signal when the data signal is lower than the reference quantity, the sample-and-hold circuit being blocked by a pulse of a system clock to form the additional voltage.

4. The method of claim 2, wherein the additional voltage is formed by having an auxiliary comparator receive the reference quantity and the data signal at respective inputs of the auxiliary comparator and by releasing a sample-and-hold circuit to sample the data signal when the data signal is lower than the reference quantity, the sample-and-hold circuit being blocked by a pulse of a system clock to form the additional voltage.

5. A circuit for detecting at least one zero crossing of a data signal, comprising:

an auxiliary comparator for generating an additional voltage resembling an offset-like change in the data signal, the auxiliary comparator comparing a reference quantity with an instantaneous value of the data signal, wherein the reference quantity is proportional to an auxiliary voltage corresponding to half of the value of a difference between a measured maximum value of the data signal and a measured minimum of the data signal;

an adder for adding the auxiliary voltage and the additional voltage to form a total voltage;

a first comparator having a first input for receiving the data signal and a second input for receiving a reference voltage formed from the total voltage;

a second comparator having an input for receiving the data signal, the second comparator being preset to a predefined lower threshold for the data signal;

a third comparator having an input for receiving the data signal, the third comparator being preset to a predefined upper threshold;

a first timer coupled to the second comparator;

a second timer coupled to the first comparator;

a first AND element having inputs for receiving an output of the third comparator, an output of the first timer, and an output of the second timer, the first AND element producing a first triggering signal;

a third timer coupled to the third comparator;

a fourth timer coupled to the first comparator, wherein a period of time set for the third timer is shorter than a duration of time set signal, and wherein a period of time set for the fourth timer is shorter than the period of time set for the third timer but longer than a maximum expected decay time of the data signal;

a second AND element having inputs for receiving an output of the third timer, an output of the fourth timer, and an output of the second comparator, wherein the second AND element produces a second triggering pulse; and an output timer having a first input supplied with the first triggering signal and a second input supplied with the second triggering signal, wherein the output timer delivers an analysis signal corresponding to the data signal when at least one of the first triggering signal and the second triggering signal falls.

\* \* \* \* \*